United States Patent
Wang

(10) Patent No.: US 7,447,610 B2
(45) Date of Patent: *Nov. 4, 2008

(54) METHOD AND SYSTEM FOR RELIABILITY SIMILARITY OF SEMICONDUCTOR DEVICES

(75) Inventor: Eugene Wang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 428 days.

This patent is subject to a terminal disclaimer.

(21) Appl. No.: 11/252,968

(22) Filed: Oct. 17, 2005

(65) Prior Publication Data

US 2007/0072315 A1  Mar. 29, 2007

(30) Foreign Application Priority Data

Sep. 29, 2005  (CN) .................... 2005 1 0030310

(51) Int. Cl.
*G01R 31/26* (2006.01)
(52) U.S. Cl. .................... 702/181; 702/81; 702/118; 438/186; 714/755; 324/765; 250/559.45; 700/109; 700/110; 700/121; 700/11
(58) Field of Classification Search ............. 702/81, 702/179, 82, 181, 118, 33, 34; 714/755; 324/765; 250/559.45; 700/119, 110, 121, 700/11; 706/904, 906, 912, 914, 921; 257/E21.525
See application file for complete search history.

(56) References Cited

U.S. PATENT DOCUMENTS

| | | | |
|---|---|---|---|
| 5,950,181 A * | 9/1999 | Federl | 706/15 |
| 6,757,579 B1 * | 6/2004 | Pasadyn | 700/108 |
| 6,781,688 B2 * | 8/2004 | Kren et al. | 356/237.4 |
| 6,795,800 B1 * | 9/2004 | Lee | 703/2 |
| 6,847,917 B2 * | 1/2005 | Bechhoefer | 702/183 |
| 6,906,320 B2 * | 6/2005 | Sachs et al. | 250/282 |
| 7,003,430 B2 * | 2/2006 | Wang et al. | 702/179 |
| 2003/0014144 A1 * | 1/2003 | Krivokapic et al. | 700/121 |
| 2004/0066507 A1 * | 4/2004 | Kren et al. | 356/237.4 |
| 2004/0081350 A1 * | 4/2004 | Kitamura et al. | 382/149 |
| 2004/0090639 A1 * | 5/2004 | Kubo et al. | 356/630 |
| 2004/0195500 A1 * | 10/2004 | Sachs et al. | 250/282 |
| 2004/0239347 A1 * | 12/2004 | Yamada et al. | 324/751 |
| 2005/0090027 A1 * | 4/2005 | Aghababazadeh et al. | 438/17 |
| 2005/0090916 A1 * | 4/2005 | Aghababazadeh et al. | 700/90 |

* cited by examiner

*Primary Examiner*—Carol S Tsai
(74) *Attorney, Agent, or Firm*—Townsend and Townsend and Crew LLP

(57) ABSTRACT

A method and system for reliability similarity of semiconductor devices. The method includes providing a first plurality of semiconductor devices, providing a second plurality of semiconductor devices, and determining a first reliability associated with the first plurality of semiconductor devices. The first reliability is represented by at least a first probability density function. Additionally, the method includes determining a second reliability associated with the second plurality of semiconductor devices. The second reliability is represented by at least a second probability density function. Moreover, the method includes processing information associated with the first probability density function and the second probability density function, and determining a numerical number based on at least information associated with the first probability density function and the second probability density function. The numerical number is indicative of similarity between the first reliability and the second reliability.

21 Claims, 1 Drawing Sheet

METHOD AND SYSTEM FOR RELIABILITY SIMILARITY OF SEMICONDUCTOR DEVICES

CROSS-REFERENCES TO RELATED APPLICATIONS

This application claims priority to Chinese Patent Application No. 200510030310.9, filed Sep. 29, 2005, commonly assigned, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits and their processing for the manufacture of semiconductor devices. More particularly, the invention provides a method and system for processing similarity of the manufacture of integrated circuits. Merely by way of example, the invention has been applied to reliability of semiconductor devices. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is reliability similarity between two or more of semiconductor devices.

Fabrication of custom integrated circuits using chip foundry services has evolved over the years. Fabless chip companies often design the custom integrated circuits. Such custom integrated circuits usually require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist.

For example, in semiconductor industry, IC product reliability is an important factor for business success. Rapid advances in technology, increased chip sophistication, intense global competitions, and high customer expectations have put significant pressures on semiconductor companies to produce highly reliable and safe products. Before mass production of new semiconductor devices, reliability of these semiconductor devices often are examined through a series of product qualification and process qualification procedures.

Hence, an improved technique for processing reliability of semiconductor devices is desired.

BRIEF SUMMARY OF THE INVENTION

The present invention is directed to integrated circuits and their processing for the manufacture of semiconductor devices. More particularly, the invention provides a method and system for processing similarity of the manufacture of integrated circuits. Merely by way of example, the invention has been applied to reliability of semiconductor devices. But it would be recognized that the invention has a much broader range of applicability.

In a specific embodiment, the invention provides a method for reliability similarity of semiconductor devices. The method includes providing a first plurality of semiconductor devices, providing a second plurality of semiconductor devices, and determining a first reliability associated with the first plurality of semiconductor devices. The first reliability is represented by at least a first probability density function. Additionally, the method includes determining a second reliability associated with the second plurality of semiconductor devices. The second reliability is represented by at least a second probability density function. Moreover, the method includes processing information associated with the first probability density function and the second probability density function, and determining a numerical number based on at least information associated with the first probability density function and the second probability density function. The numerical number is indicative of similarity between the first reliability and the second reliability.

According to another embodiment, a method for reliability similarity of semiconductor devices includes providing a first plurality of semiconductor devices, and providing a second plurality of semiconductor devices. Additionally, the method includes testing the first plurality of semiconductor devices to obtain a first plurality of data, processing information associated with the first plurality of data, and determining a first reliability associated with the first plurality of semiconductor devices based on at least information associated with the first plurality of data. Moreover, the method includes testing the second plurality of semiconductor devices to obtain a second plurality of data, processing information associated with the second plurality of data, and determining a second reliability associated with the second plurality of semiconductor devices based on at least information associated with the second plurality of data. Also, the method includes processing information associated with the first reliability and the second reliability, and determining a numerical number based on at least information associated with the first reliability and the second reliability. The numerical number is indicative of similarity between the first reliability and the second reliability.

According to yet another embodiment, a computer-readable medium including instructions for reliability similarity of semiconductor devices includes one or more instructions for receiving a first plurality of testing results associated with a first plurality of semiconductor devices, and one or more instructions for receiving a second plurality of testing results associated with a second plurality of semiconductor devices. Additionally, the computer-readable medium includes one or more instructions for processing information associated with the first plurality of testing results, one or more instructions for determining a first reliability associated with the first plurality of semiconductor devices based on at least information associated with the first plurality of testing results, one or more instructions for processing information associated with the second plurality of testing results, and one or more instructions for determining a second reliability associated with the second plurality of semiconductor devices based on at least information associated with the second plurality of testing results. Moreover, the computer-readable medium includes one or more instructions for processing information associated with the first reliability and the second reliability, and one or more instructions for determining a numerical number based on at least information associated with the first reliability and the second reliability. The numerical number is indicative of similarity between the first reliability and the second reliability.

Many benefits are achieved by way of the present invention over conventional techniques. For example, the present technique provides an easy to use process that relies upon conventional technology. In some embodiments, the method provides accurate determination of reliability similarity between two or more of semiconductor devices. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
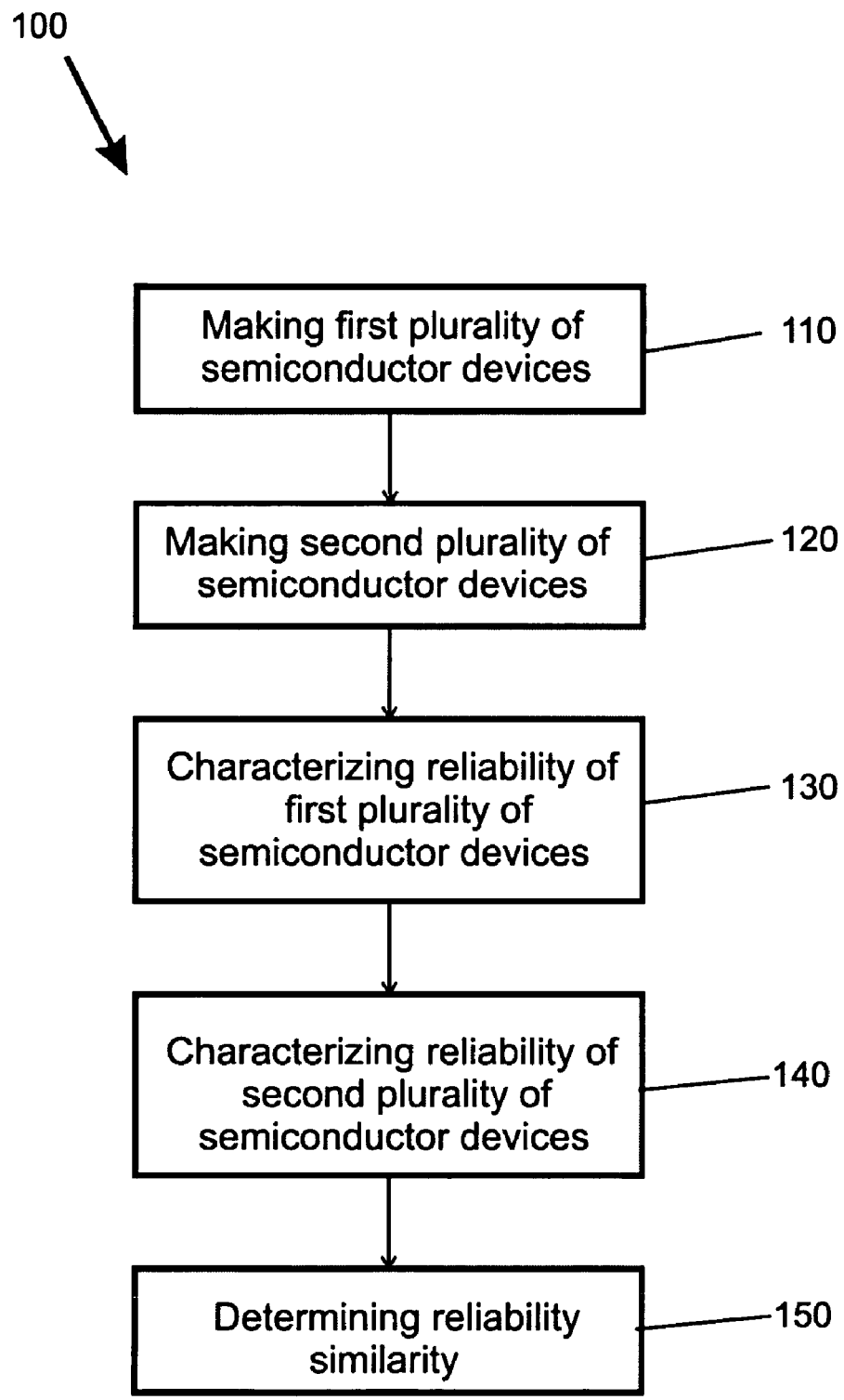
FIG. 1 is a simplified method for reliability similarity of semiconductor devices according to an embodiment of the present invention.

The present invention is directed to integrated circuits and their processing for the manufacture of semiconductor devices. More particularly, the invention provides a method and system for processing similarity of the manufacture of integrated circuits. Merely by way of example, the invention has been applied to reliability of semiconductor devices. But it would be recognized that the invention has a much broader range of applicability.

FIG. 1 is a simplified method for reliability similarity of semiconductor devices according to an embodiment of the present invention. This diagram is merely an example, which should not unduly limit the scope of the claims herein. The method 100 includes the following processes:

1. Process 110 for making first plurality of semiconductor devices;
2. Process 120 for making second plurality of semiconductor devices;
3. Process 130 for characterizing reliability of first plurality of semiconductor devices;
4. Process 140 for characterizing reliability of second plurality of semiconductor devices;
5. Process 150 for determining reliability similarity.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

At the process 110, a first plurality of semiconductor devices is fabricated. The semiconductor device may include various types of transistors, diodes, resistors, inductors, or others. Additionally, the semiconductor device may be a starting product, an intermediate product, and/or a final product of transistors, diodes, resistors, inductors, and/or others. In one embodiment, the fabrication of a transistor starts with a starting product and includes various processing steps. For example, the starting product includes a semiconductor substrate. The semiconductor may be silicon, germanium, gallium arsenide, or other material. The processing steps may include deposition, anneal, ion implantation, etching, or other. After each processing step, the resulting structure is an intermediate product.

At the process 120, a second plurality of semiconductor devices is fabricated. By design, the second plurality of semiconductor devices has at least one characteristic the same as the first plurality of semiconductor devices. In one embodiment, the characteristic is a device or wafer acceptance parameter. For example, the characteristic is sheet resistance or breakdown voltage. In another embodiment, the second plurality of semiconductor devices has the same structural and functional specifications as the first plurality of semiconductor devices. For example, the second plurality of semiconductor devices by design is made with starting structures and fabrication processes the same as ones for the first plurality of semiconductor devices.

In one embodiment, the first plurality of semiconductor devices and the second plurality of semiconductor devices are made on the same production line. In another embodiment, the first plurality of semiconductor devices is made on a first production line or at a first production site, and the second plurality of semiconductor devices is made on a second production line or at a second production site. For example, the first production line and the second production line are within the same production site or belong to different production sites. In one embodiment, the first production line and the second production line share at least some fabrication tools. In another embodiment, the first production line and the second production line do not share any fabrication tool. In yet another embodiment, the first production site and the second production site both use certain types of fabrication tools. For example, an anneal chamber used at the first production site has a model number that is the same as at the second production site. In yet another embodiment, the first production site and the second production site do not both use any same type of fabrication tool. For example, an anneal chamber used at the first production site is made by a manufacturer different from one at the second production site.

At the process 130, reliability of the first plurality of semiconductor devices is characterized. In one embodiment, the failure rate is used as an index for representing reliability of the first plurality of semiconductor devices. In another embodiment, the reliability is characterized by a probability distribution for a random variable, i.e., failure time T. The probability distribution is represented by a cumulative distribution function and/or a probability density function. In one embodiment, the cumulative distribution function (cdf) of T is shown as follows:

$$F(t)=Pr(T \leq t) \quad \text{(Equation 1)}$$

where F(t) is the cumulative distribution function. For example, the cumulative distribution function provides the probability that one of the first plurality of semiconductor devices would fail before or up to time t. In another example, the cumulative distribution function provides the proportion of the first plurality of semiconductor devices that would fail before or up to time t.

In another embodiment, the probability density function (pdf) of T is shown as follows:

$$f(t) = \frac{dF(t)}{dt} \quad \text{(Equation 2)}$$

where f(t) is the probability density function. For example, the probability density function represents relative frequency of failure as a function of time.

According to one embodiment of the present invention, the failure time T follows a Weibull distribution. For example, the cumulative distribution function and the probability density function are characterized by the following equations:

$$F(t) = 1 - \exp\left\{-\left(\frac{t}{\eta}\right)^\beta\right\}, t > 0 \quad \text{(Equation 3)}$$

$$f(t) = \frac{\beta}{\eta}\left(\frac{t}{\eta}\right)^{\beta-1} \exp\left\{-\left(\frac{t}{\eta}\right)^\beta\right\}, t > 0 \quad \text{(Equation 4)}$$

where $\eta$ and $\beta$ are called the scale parameter and the shape parameter respectively. Additionally, up to a time $t_p$, a specified proportion p of the first plurality of semiconductor devices would fail. Accordingly, the time $t_p$ satisfies $$F(t_p)=p \quad \text{(Equation 5)}$$

and can be represented by $$t_p = F^{-1}(p) \quad \text{(Equation 6)}$$

For example, the time $t_p$ is called quantile. In another example, the time $t_p$ is a unique inverse value for the probability density function in Equation 4.

At the process 130, the first plurality of semiconductor device is tested according to an embodiment of the present invention. The testing can be performed under various conditions. For example, the testing is an accelerated reliability test. In another example, the testing is a stress test. In yet another example, the testing is performed under high pressure, high temperature, high current, and/or high voltage. The testing can performed with respect to various reliability parameters, such as time dependent dielectric breakdown, charge before breakdown, and/or early failure rate.

During testing, the proportion F(t) of the first plurality of semiconductor devices that has failed is determined at each time t. For example, the time t is selected from a group of n time values. In another example, at t equal to 3 hours, 10% of the first plurality of semiconductor devices has failed. At t equal to 4 hours, still 10% of the first plurality of semiconductor devices has failed. At t equal to 5 hours, 20% of the first plurality of semiconductor devices has failed. At t equal to 90 hours, 100% of the first plurality of semiconductor devices has failed.

The measured values for F(t) as a function of time t are used to determined the scale parameter $\eta$ and the shape parameter $\beta$. For example, $\eta$ and $\beta$ are determined as maximum likelihood estimators (MLE). In another example, $\eta$ and $\beta$ are determined as least square estimators (LSE). For example, the least square estimators are calculated with an analysis procedure using Weibull probability paper. In another example, the least square estimators are calculated with a linear regression procedure.

At the process 140, reliability of the second plurality of semiconductor devices is characterized. In one embodiment, the failure rate is used as an index for representing reliability of the second plurality of semiconductor devices. In another embodiment, the reliability is characterized by a probability distribution for a random variable, i.e., failure time T. The probability distribution are represented by a cumulative distribution function F(t) and/or a probability density function f(t). For example, the cumulative distribution function provides the probability that one of the second plurality of semiconductor devices would fail before or up to time t. In another example, the cumulative distribution function provides the proportion of the second plurality of semiconductor devices that would fail before or up to time t. In yet another example, the probability density function represents relative frequency of failure as a function of time.

According to one embodiment of the present invention, the failure time T follows a Weibull distribution. For example, the cumulative distribution function and the probability density function are characterized by the scale parameter $\eta$ and the shape parameter $\beta$ according to Equations (3) and (4) respectively. Additionally, up to a time $t_p$, a specified proportion p of the second plurality of semiconductor devices would fail.

At the process 140, the second plurality of semiconductor device is tested according to an embodiment of the present invention. The testing can be performed under various conditions. For example, the testing is an accelerated reliability test. In another example, the testing is a stress test. In yet another example, the testing is performed under high pressure, high temperature, high current, and/or high voltage. The testing can performed with respect to various reliability parameters, such as time dependent dielectric breakdown, charge before breakdown, and/or early failure rate. During testing, the proportion F(t) of the second plurality of semiconductor devices that has failed is determined at each time t. For example, the time t is selected from a group of m time values. The measured values for F(t) as a function of time t are used to determined the scale parameter $\eta$ and the shape parameter $\beta$. For example, $\eta$ and $\beta$ are determined as maximum likelihood estimators (MLE). In another example, $\eta$ and $\beta$ are determined as least square estimators (LSE). For example, the least square estimators are calculated with an analysis procedure using Weibull probability paper. In another example, the least square estimators are calculated with a linear regression procedure.

At the process 150, reliability similarity between the first plurality of semiconductor devices and the second plurality of semiconductor devices is determined. In one embodiment, an index is determined to quantitatively measure the reliability similarity between the first plurality of semiconductor devices and the second plurality of semiconductor devices. In another embodiment, the probability density function $f_A(t)$ for the first plurality of semiconductor devices and the probability density function $f_B(t)$ for the second plurality of semiconductor devices are as shown below.

$$f_A(t) = \frac{\beta_1}{\eta_1}\left(\frac{t}{\eta_1}\right)^{\beta_1-1} \exp\left\{-\left(\frac{t}{\eta_1}\right)^{\beta_1}\right\}, t > 0 \quad \text{(Equation 7)}$$

$$f_B(t) = \frac{\beta_2}{\eta_2}\left(\frac{t}{\eta_2}\right)^{\beta_2-1} \exp\left\{-\left(\frac{t}{\eta_2}\right)^{\beta_2}\right\}, t > 0 \quad \text{(Equation 8)}$$

where $\eta_1$ and $\beta_1$ are determined at the process 130 and $\eta_2$ and $\beta_2$ are determined at the process 140. Accordingly, in one embodiment, the reliability similarity between the first plurality of semiconductor devices and the second plurality of semiconductor devices is determined as follows:

$$RS_{AB} = \left(\frac{1}{2}\int_0^D [J \times f_A(x) + K \times f_B(x)]\, dx\right)\Big/ L, \quad \text{(Equation 9)}$$

$$D = \min\{F_A^{-1}(L), F_B^{-1}(L)\} \quad \text{(Equation 10)}$$

where $RS_{AB}$ is an index representing the reliability similarity. J and K are positive numbers, the sum of which is equal to two. L is a positive number that is smaller than one.

For example, J and K each are equal to one. L is equal to 99%. Hence the reliability similarity is characterized by $$RS_{AB} = \left(\frac{1}{2}\int_0^D [f_A(x) + f_B(x)]\, dx\right)\Big/ 99\% \quad \text{(Equation 11)}$$

$$D = \min\{F_A^{-1}(99\%), F_B^{-1}(99\%)\} \quad \text{(Equation 12)}$$

In one embodiment, the reliability similarity is considered satisfactory if $RS_{AB}$ falls within a first range, to be in need for improvement if $RS_{AB}$ falls within a second range, and to be unsatisfactory if $RS_{AB}$ falls within a third range. For example, the first range is equal to or higher than 99%, the second range is lower than 99% and higher than 95%, and the third range is equal to or lower than 95%.

As discussed above and further emphasized here, FIG. 1 is merely an example, which should not unduly limit the scope of the claims. One of ordinary skill in the art would recognize many variations, alternatives, and modifications. In one embodiment, the reliability similarity determined at the process 150 represents the reliability similarity between a first semiconductor device and a second semiconductor device. The first semiconductor device is representative of the first plurality of semiconductor devices, and the second semiconductor device is representative of the second plurality of semiconductor devices. In another embodiment, the method 100 is applied to any product, not limited to semiconductor device. In yet another embodiment, the method 100 is applied to life sciences.

According to another embodiment, a method for reliability similarity of semiconductor devices includes providing a first plurality of semiconductor devices, providing a second plurality of semiconductor devices, and determining a first reliability associated with the first plurality of semiconductor devices. The first reliability is represented by at least a first probability density function. Additionally, the method includes determining a second reliability associated with the second plurality of semiconductor devices. The second reliability is represented by at least a second probability density function. Moreover, the method includes processing information associated with the first probability density function and the second probability density function, and determining a numerical number based on at least information associated with the first probability density function and the second probability density function. The numerical number is indicative of similarity between the first reliability and the second reliability. For example, the method is implemented according to the method 100.

According to yet another embodiment, a method for reliability similarity of semiconductor devices includes providing a first plurality of semiconductor devices, and providing a second plurality of semiconductor devices. Additionally, the method includes testing the first plurality of semiconductor devices to obtain a first plurality of data, processing information associated with the first plurality of data, and determining a first reliability associated with the first plurality of semiconductor devices based on at least information associated with the first plurality of data. Moreover, the method includes testing the second plurality of semiconductor devices to obtain a second plurality of data, processing information associated with the second plurality of data, and determining a second reliability associated with the second plurality of semiconductor devices based on at least information associated with the second plurality of data. Also, the method includes processing information associated with the first reliability and the second reliability, and determining a numerical number based on at least information associated with the first reliability and the second reliability. The numerical number is indicative of similarity between the first reliability and the second reliability. For example, the method is implemented according to the method 100.

According to yet another embodiment, some or all processes of the method 100 can be performed by a computer system. For example, a computer-readable medium including instructions for reliability similarity of semiconductor devices includes one or more instructions for receiving a first plurality of testing results associated with a first plurality of semiconductor devices, and one or more instructions for receiving a second plurality of testing results associated with a second plurality of semiconductor devices. Additionally, the computer-readable medium includes one or more instructions for processing information associated with the first plurality of testing results, one or more instructions for determining a first reliability associated with the first plurality of semiconductor devices based on at least information associated with the first plurality of testing results, one or more instructions for processing information associated with the second plurality of testing results, and one or more instructions for determining a second reliability associated with the second plurality of semiconductor devices based on at least information associated with the second plurality of testing results. Moreover, the computer-readable medium includes one or more instructions for processing information associated with the first reliability and the second reliability, and one or more instructions for determining a numerical number based on at least information associated with the first reliability and the second reliability. The numerical number is indicative of similarity between the first reliability and the second reliability.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for reliability similarity of semiconductor devices, the method comprising:
providing a first plurality of semiconductor devices;
providing a second plurality of semiconductor devices;
determining a first reliability associated with the first plurality of semiconductor devices, the first reliability being represented by at least a first probability density function;
determining a second reliability associated with the second plurality of semiconductor devices, the second reliability being represented by at least a second probability density function;
processing information associated with the first probability density function and the second probability density function;
determining a numerical number based on at least information associated with the first probability density function and the second probability density function;
wherein the numerical number is indicative of similarity between the first reliability and the second reliability.

2. The method of claim 1 wherein the first reliability is further represented by a first cumulative distribution function.

3. The method of claim 1 wherein the determining a first reliability of the first plurality of semiconductor devices comprises:
testing the first plurality of semiconductor devices;
measuring a plurality of values at a plurality of times, each of the plurality of values representing a proportion of the first plurality of semiconductor devices that has failed at corresponding one of the plurality of times under the testing;
determining the first probability density function based on at least information associated with the plurality of measured values at the plurality of times.

4. The method of claim 3 wherein the first probability density is associated with a Weibull distribution.

5. The method of claim 3 wherein the first probability density function is associated with a first parameter and a second parameter.

6. The method of claim 5 wherein the determining the first probability density function comprises determining the first parameter and the second parameter based on at least information associated with the plurality of measured values at the plurality of times.

7. The method of claim 6 wherein the determining the first parameter and the second parameter comprises performing a procedure associated with maximum likelihood estimators.

8. The method of claim 6 wherein the determining the first parameter and the second parameter comprises performing a procedure associated with least square estimators.

9. The method of claim 3 wherein the testing the first plurality of semiconductor devices is associated with at least one parameter selected from a group consisting of time dependent dielectric breakdown, charge before breakdown, and early failure rate.

10. The method of claim 1, and further comprising determining whether the similarity between the first reliability and the second reliability is satisfactory based on at least information associated with the numerical number.

11. The method of claim 10 wherein the determining whether the similarity between the first reliability and the second reliability is satisfactory comprises determining the similarity to be satisfactory if the numerical number is within a range.

12. A method for reliability similarity of semiconductor devices, the method comprising:
providing a first plurality of semiconductor devices;
providing a second plurality of semiconductor devices;
testing the first plurality of semiconductor devices to obtain a first plurality of data;
processing information associated with the first plurality of data;
determining a first reliability associated with the first plurality of semiconductor devices based on at least information associated with the first plurality of data;
testing the second plurality of semiconductor devices to obtain a second plurality of data;
processing information associated with the second plurality of data;
determining a second reliability associated with the second plurality of semiconductor devices based on at least information associated with the second plurality of data;
processing information associated with the first reliability and the second reliability;
determining a numerical number based on at least information associated with the first reliability and the second reliability, the numerical number being indicative of similarity between the first reliability and the second reliability.

13. The method of claim 12 wherein:
the first reliability is represented by at least a first probability density function;
the second reliability is represented by at least a second probability density function.

14. The method of claim 12 wherein the testing the first plurality of semiconductor devices to obtain a first plurality of data comprises measuring a plurality of values at a plurality of times, each of the plurality of values representing a proportion of the first plurality of semiconductor devices that has failed at corresponding one of the plurality of times under the testing.

15. The method of claim 12 wherein the first reliability is associated with a first probability density function.

16. The method of claim 15 wherein the determining a first reliability comprises determining the first probability density function based on at least information associated with the first plurality of data.

17. The method of claim 15 wherein the first probability density function is associated with a Weibull distribution.

18. The method of claim 12, and further comprising determining whether the similarity between the first reliability and the second reliability is satisfactory based on at least information associated with the numerical number.

19. A computer-readable medium including instructions for reliability similarity of semiconductor devices, the computer-readable medium comprising:
one or more instructions for receiving a first plurality of testing results associated with a first plurality of semiconductor devices;
one or more instructions for receiving a second plurality of testing results associated with a second plurality of semiconductor devices;
one or more instructions for processing information associated with the first plurality of testing results;
one or more instructions for determining a first reliability associated with the first plurality of semiconductor devices based on at least information associated with the first plurality of testing results;

one or more instructions for processing information associated with the second plurality of testing results;

one or more instructions for determining a second reliability associated with the second plurality of semiconductor devices based on at least information associated with the second plurality of testing results;

one or more instructions for processing information associated with the first reliability and the second reliability;

one or more instructions for determining a numerical number based on at least information associated with the first reliability and the second reliability, the numerical number being indicative of similarity between the first reliability and the second reliability.

20. The computer-readable medium of claim 19, and further comprising one or more instructions for determining whether the similarity between the first reliability and the second reliability is satisfactory based on at least information associated with the numerical number.

21. The computer-readable medium of claim 20 wherein the one or more instructions for determining whether the similarity between the first reliability and the second reliability is satisfactory comprises one or more instructions for determining the similarity to be satisfactory if the numerical number is within a range.

* * * * *